US010855055B2

(12) United States Patent
Bloemen et al.

(10) Patent No.: US 10,855,055 B2
(45) Date of Patent: Dec. 1, 2020

(54) VCSEL ARRAY WITH COMMON WAFER LEVEL INTEGRATED OPTICAL DEVICE

(71) Applicant: TRUMPF Photonic Components GmbH, Ulm (DE)

(72) Inventors: Pascal Jean Henri Bloemen, Eindhoven (NL); Stephan Gronenborn, Ulm (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 0 days.

(21) Appl. No.: 16/796,959

(22) Filed: Feb. 21, 2020

(65) Prior Publication Data

US 2020/0194973 A1    Jun. 18, 2020

Related U.S. Application Data

(63) Continuation of application No. PCT/EP2018/072747, filed on Aug. 23, 2018.

(30) Foreign Application Priority Data

Aug. 23, 2017 (EP) ..................... 17187428

(51) Int. Cl.
*H01S 5/18* (2006.01)
*H01S 5/183* (2006.01)
(Continued)

(52) U.S. Cl.
CPC ........ *H01S 5/18388* (2013.01); *G01S 7/4815* (2013.01); *H01S 5/0267* (2013.01);
(Continued)

(58) Field of Classification Search
CPC ...... H01S 5/026; H01S 5/18388; H01S 5/423; H01S 5/02272; H01S 5/18311;
(Continued)

(56) References Cited

U.S. PATENT DOCUMENTS

| 9,048,633 B2 | 6/2015 | Gronenborn et al. |
| 2009/0097522 A1* | 4/2009 | Justice ................ H01S 5/18386 |
| | | 372/50.11 |

(Continued)

FOREIGN PATENT DOCUMENTS

WO    WO 2017055160 A1    4/2017

*Primary Examiner* — Luke D Ratcliffe
(74) *Attorney, Agent, or Firm* — Leydig, Voit & Mayer, Ltd.

(57) ABSTRACT

A VCSEL array has VCSELs on a semiconductor substrate and has a prismatic or Fresnel optical structure, which is arranged to transform laser light to provide a continuous illumination pattern in a reference plane. The optical structure increases a size of the illumination pattern in comparison to an untransformed illumination pattern. The optical structure is arranged such that each VCSEL illuminates a sector of the pattern. Sub-surfaces of the optical structure with different height above the semiconductor substrate are arranged next to each other. Each VCSEL is associated with a sub-surface. A distance between each VCSEL and a size of its sub-surface is arranged such that the VCSEL illuminates only a part of the sub-surface without illuminating one of the steps. The VCSEL array has an array of microlenses, each VCSEL being associated with a microlens arranged to collimate the laser light after traversing the optical structure.

10 Claims, 9 Drawing Sheets

(51) Int. Cl.
  *G01S 7/481* (2006.01)
  *H01S 5/022* (2006.01)
  *H01S 5/026* (2006.01)
  *H01S 5/42* (2006.01)

(52) U.S. Cl.
  CPC ...... *H01S 5/02288* (2013.01); *H01S 5/18305* (2013.01); *H01S 5/423* (2013.01)

(58) Field of Classification Search
  CPC .............. H01S 5/0224; H01S 5/18347; H01S 5/02276; H01S 5/02469; H01S 5/0014; H04N 5/332; H04N 5/2354; H04N 5/2256
  See application file for complete search history.

(56) References Cited

U.S. PATENT DOCUMENTS

| | | | |
|---|---|---|---|
| 2012/0147912 A1* | 6/2012 | Moench | H01S 5/14 372/29.02 |
| 2015/0097947 A1 | 4/2015 | Hudman et al. | |
| 2016/0164261 A1* | 6/2016 | Warren | H01S 5/026 348/164 |
| 2016/0254638 A1* | 9/2016 | Chen | H04N 13/254 362/11 |
| 2017/0033535 A1 | 2/2017 | Joseph | |

\* cited by examiner

VCSEL ARRAY WITH COMMON WAFER LEVEL INTEGRATED OPTICAL DEVICE

CROSS-REFERENCE TO PRIOR APPLICATIONS

This application is a continuation of International Patent Application No. PCT/EP2018/072747, filed on 23 Aug. 2018, which claims priority to European Patent Application No. 17 187 428.2, filed on 23 Aug. 2017. The entire disclosure of both applications is hereby incorporated by reference herein.

FIELD

The invention relates to a Vertical Cavity Surface Emitting Laser (VCSEL) array with common wafer level integrated optical device, a lighting device comprising such a VCSEL array, a time-of-flight camera comprising such a lighting device and a method of manufacturing the VCSEL array.

BACKGROUND

Laser arrangements including a VCSEL array can be used for infrared illumination devices. Using short pulses VCSEL arrays are, for example, applied in time-of-flight applications. Such applications include, e.g., short-range gesture recognition for portable devices and 3D space recognition. VCSEL arrays of about 1 mm$^2$ area with output power in the 1-10 W range are discussed for such applications. A specific field of illumination or view is defined by the application (e.g. a time-of-flight camera observing e.g. 70°×50°).

US 2016/0164261 A1 discloses methods, devices and systems for selectively illuminating different zones of a field of view by a multi-zone illumination device. The multi-zone illuminator may include a plurality of vertical cavity surface emitting lasers (VCSELs), and a plurality of micro-optical devices aligned with apertures of individual or groups of VCSELs, which are configured to be individually activated to provide adjustable illumination to different zones of a field of view of an image sensor.

US 2017/033535 A1 discloses an apparatus that includes a single laser emitting epitaxial structure that includes a plurality of laser regions, each laser region of the single laser emitting epitaxial structure being electrically isolated within the single laser emitting epitaxial structure itself relative to the other laser regions of the single laser emitting epitaxial structure, and an electrical waveguide configured to provide current to the laser regions.

SUMMARY

In an embodiment, the present invention provides a vertical cavity surface emitting laser (VCSEL) array that has two, three, four, or more VCSELs arranged on a common semiconductor substrate. The VCSEL array further has one common optical structure integrated on a wafer level. The common optical structure is arranged to transform laser light to transformed laser light such that a continuous illumination pattern can be provided in a reference plane. The common optical structure is arranged to increase a size of the illumination pattern in the reference plane in comparison to an untransformed illumination pattern providable without the common optical structure. The common optical structure is further arranged such that each of the VCSELs is arranged to illuminate a sector of the illumination pattern, the sector being smaller than the illumination pattern. The common optical structure has steps such that sub-surfaces of the common optical structure with a different height above the common semiconductor substrate are arranged next to each other. The common optical structure is a prismatic structure or a Fresnel structure. Each of the VCSELs is associated with a sub-surface of the sub-surfaces of the common optical structure. A distance between each of the VCSELs and a size of the respective sub-surface of the common optical structure is arranged such that each of the VCSELs illuminates only a part of the respective sub-surface of the common optical structure without illuminating one of the steps. The VCSEL array has an array of microlenses. Each of the VCSELs is associated with a microlens of the array of microlenses, the microlens being arranged to collimate the laser light after traversing the common optical structure.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Embodiments of the present invention provide an improved VCSEL array with a common wafer-scale optical element.

According to a first aspect, a VCSEL array is provided. The VCSEL array includes two, three, four or more VCSELs arranged on a common semiconductor substrate. The VCSEL array further includes one common optical structure integrated on wafer level. The common optical structure is arranged to transform laser light such that a reference plane can be illuminated. The common optical structure is arranged to transform the laser light to transformed laser light such that a continuous illumination pattern can be provided in the reference plane. The common optical structure is arranged to increase a size of the illumination pattern in comparison to an untransformed illumination pattern which can be provided without the common optical structure. The illumination pattern may be increased or widened in accordance with ISO Norm 11146-1:2005. The ISO Norm 11146-1:2005 is incorporated by reference. The common optical structure is further arranged such that each VCSEL is arranged to illuminate a sector of the illumination pattern, where each sector is smaller than the illumination pattern.

The common optical structure is integrated on wafer level by coupling the common optical structure to a surface of a semiconductor wafer including a multitude of VCSEL arrays and corresponding semiconductor substrates before separating the single VCSEL arrays. The common optical structure is permanently coupled to the surface of the semiconductor wafer. The common optical structure is preferably coupled to the surface of the semiconductor wafer such that it cannot be removed without damaging the respective VCSEL array. The common optical structure may consist of a transparent (with respect to the e.g. infrared laser light) optical polymer (e.g. UV- or blue light curable polymers) deposited on top of the semiconductor layer structure of the VCSELs included by the VCSEL arrays after processing the VCSELs but before separating the single VCSEL arrays by, for example, dicing. The common optical structure may alternatively be etched in the semiconductor substrate of the wafer. Alternatively or in addition a glass wafer including a common optical structures may be bonded, for example, by means of a transparent adhesive or any other suitable bonding technology to the semiconductor wafer including the multitude of VCSEL arrays.

Common optical structure means that the optical structure provides a common optical function. The common optical function is characterized by transforming the light emitted by each VCSEL of the corresponding VCSEL array such that the respective sector of illumination pattern is illuminated. The common optical structure provides a spreading of the illumination pattern in comparison to a raw illumination pattern which could be provided by means of the VCSELs included by the VCSEL array without the common optical structure. The illumination pattern is continuous in the sense that there are no steps. An intensity distribution function describing the illumination pattern in the reference plane is differentiable. Examples of such intensity distributions may, for example, be an essentially constant intensity in the reference plane in a defined field of view or an essentially constant intensity with respect to the solid angle defined by the respective field of view (this results in an intensity distribution in the reference plane which varies with the cube of cosine with respect to the angle to the optical axis connecting the reference plane and the center of the VCSEL array). The sectors illuminated by single VCSELs of the VCSEL array may overlap.

The common optical structure may be a continuous structure arranged above the light emitting surfaces of the VCSELs. The continuous structure may, for example, be a continuous "block" of polymer or a continuous surface structure etched in the semiconductor substrate or a glass wafer.

The VCSELs are characterized by an active laser light emission area with an area between 3 $\mu m^2$ and 10000 $\mu m^2$. The pitch or distance between the VCSELs included by the VCSEL array may be between 20 $\mu m$ and 250 $\mu m$. The density of the VCSELs and/or the size light emission area may be different depending on the position in the VCSEL array and/or the shape of the common optical structure illuminated by the respective VCSEL such that the intensity of the illumination pattern can be adapted.

The common optical structure may include steps such that sub-surfaces of the common optical structure with different height above the semiconductor substrate are arranged next to each other. The surface of the common optical structure may in case of a continuous common optical structure include an imaging surface for transforming the laser light which is continuous but not differentiable in a mathematical sense. The common optical structure may be a prismatic structure with flat sub-surfaces. The common optical structure may alternatively be a Fresnel structure like a Fresnel lens. The sub-surfaces are in this case curved. The steps of the prismatic or Fresnel structure may enable a comparably low building height of the common optical structure above the processing surface of the semiconductor wafer in comparison to an imaging surface which is mathematically continuous and differentiable (see FIG. 1). The building height is preferably less than 200 $\mu m$, more preferably less than 100 $\mu m$. The step height and the distance between the light emitting surface of a VCSEL or group of VCSELs and the respective sub-surface may be different depending on the position within the VCSEL array. The distance between the light emitting surface of a VCSEL or group of VCSELs and the respective sub-surface may, for example, increase with increasing distance to the center of the VCSEL array.

The steps of the common optical structure may cause optical losses if the light emitted by the VCSELs hits one of the steps. This light may be redirected because of this step in a direction out of the intended illumination pattern and therefore not contribute to the illumination pattern in the defined field of view (e.g. 70°×50°). Each VCSEL (or sub-groups of VCSELs) may therefore be associated with a sub-surface of the common optical structure. A distance between each VCSEL and a size of the respective sub-surface of the common optical structure is arranged such that each VCSEL illuminates only a part of the respective sub-surface of the common optical structure without illuminating one of the steps. A divergence angle of a VCSEL is usually 20° in air with respect to a surface normal of the light emitting surface of the VCSEL. The divergence angle and the size of the light emitting surface as well as the distance to the respective sub-surface determines the maximum height (distance between the sub-surface and the light emitting area of the VCSEL) of the common optical structure. Furthermore, the arrangement of the VCSELs within the VCSEL array has to be taken into account as well as the intended illumination pattern in order to avoid losses caused by the steps. The VCSELs of the VCSEL array may be arranged in a regular pattern (rectangular, hexagonal etc.) or a pattern which is adapted to the intended illumination pattern in the field of view (e.g. high intensity of the VCSELs in a rim of the VCSEL array).

The VCSELs of the VCSEL array may be bottom emitters which are arranged to emit the laser light through the semiconductor substrate. The common optical structure may in this case be provided on a surface of the semiconductor substrate which is arranged opposite with respect to processing surface on which the VCSELs are provided.

The common optical structure may be integrated, especially etched in the semiconductor substrate of the VCSEL array. The high refractive index of the semiconductor substrate (gallium arsenide n~3.5) enables a relatively flat profile of the common optical structure. A planarization layer may be provided after integrating the common optical structure in the semiconductor substrate.

The common optical structure may alternatively be provided on a glass wafer which is bonded to the semiconductor substrate. The common optical structure may, for example, be etched in the glass wafer prior or after bonding to the semiconductor substrate. The glass wafer may be, for example, glued.

The VCSELs of the VCSEL array may alternatively be top emitters which are arranged to emit the laser light in a direction away from the semiconductor substrate. The common optical structure may include in this embodiment transparent material provided on top of the semiconductor layer structure of the VCSEL array. The material is transparent in the wavelength range of the laser light (e.g. in the wavelength range between 750 nm-1200 nm). The transparent material may be UV- or blue light curable optical polymer as described above. The transparent material may be provided on top of the mesas of the VCSELs. Alternatively, a planarization layer may be provided in order to provide an essentially plain surface at the level of the light emitting areas of the single VCSELs. The transparent material of the common optical structure may be deposited on top of the planarization layer.

The VCSEL array may further include an array of microlenses. Each VCSEL is associated with a microlens. The microlens is arranged to collimate the laser light emitted by the corresponding VCSEL after traversing the common optical structure. The focal length or optical shape of the microlenses may be different depending on the position of the respective VCSEL in the VCSEL array. The additional micro lenses may enable a steeper slope in a rim of the intensity distribution of the illumination pattern in the intended field of view. Efficiency may therefore be improved.

The VCSEL array may, for example, include a multitude of bottom emitting VCSELs. The common optical structure is etched in the semiconductor substrate. The common optical structure includes steps such that sub-surfaces of the common optical structure with different height above a reference surface which is parallel to the processing surface of the semiconductor substrate. Each VCSEL is associated with a sub-surface of the common optical structure. A distance between the VCSELs of the VCSEL array and a size of the respective sub-surface of the common optical structure are arranged such that each VCSEL illuminates only a part of the respective sub-surface of the common optical structure without illuminating one of the steps. The array of micro lenses may be integrated in a transparent carrier like a glass substrate. The transparent carrier is mechanically coupled to the semiconductor substrate. The transparent carrier may, for example, be glued by means of an in comparison to the refractive index of the semiconductor substrate low refractive index adhesive to the surface of the common optical structure. Alternatively, the transparent carrier may be bonded to a low refractive index planarization layer provided on top of the common optical structure. The microlenses may alternatively be etched in the semiconductor substrate such that the microlenses are arranged directly on top of the common optical structure. A planarization layer may be provided on top of the common optical structure. The planarization layer may be characterized by a relatively low refractive index in comparison to the refractive index of the semiconductor substrate. The influence with respect to the transformation properties of the common optical structure may therefore be limited and/or be considered in the design of the common optical structure. The microlenses may be provided in or on top of the planarization layer. One or more further material layers may, for example, be provided on top of the planarization layer. The microlenses may, for example, be provided by means of etching the one or more further material layers.

At least a part of the VCSELs may be arranged to be individually controlled to emit laser light. Each VCSEL or two, three, four or more groups of VCSELs of the VCSEL array may be arranged to be individually switched on or off in order to illuminate one or more sectors of the illumination pattern in a defined sequence. The VCSEL array includes respective electrodes in order to enable individual control of the VCSELs or groups of VCSELs. Individual control of the VCSELs or groups of VCSELs (sub-arrays) may allow electronic adjustment of the illumination pattern (e.g. more light in a sector including an otherwise dark corner) or defined illumination sequences.

According to a second aspect a light emitting device is provided. The light emitting device includes at least one VCSEL array as described above and an electrical driver for electrically driving the VCSELs of the VCSEL array. The light emitting device may further include a controller for providing control signals for controlling the electrical driver. The controller may, for example, include a storage device for storing data and a processing device for executing instructions included by the stored data. The stored data may, for example, include a sequence of providing an electrical drive current to the VCSELs or groups of VCSELs.

VCSEL array or lighting device may be used in consumer devices (e.g. smartphones), vehicles as well as high power industrial applications in order to support:
  consumer and portable applications as gesture interface or 3D scanner in smart-phones, lap-top, tablet,
  user interface or indoor navigation for robotics, sports, industry, lighting,
  high end for automotive mid-range detection (park assist, safe city driving),
  high power industrial applications.

According to the third aspect a time-of-flight camera is provided. The time-of-flight camera includes the light emitting device according to any embodiment described above, a light detector, an optical imaging structure and an evaluator. The optical imaging structure is arranged to image transformed laser light reflected by an object to the light detector. The evaluator is arranged to determine a distance to the object by means of the image of the transformed laser light detected by the light detector.

According to a fourth aspect a method of fabricating a VCSEL array according to any embodiment described above is provided. The method includes the steps of:
  providing a semiconductor wafer including a multitude of semiconductor substrate,
  providing at least two VCSELs on the respective semiconductor substrate,
  integrating a common optical structure on wafer level,
  arranging the common optical structure to provide transformed laser light in a reference plane, where the common optical structure is arranged to transform the laser light to transformed laser light such that a continuous illumination pattern can be provided in the reference plane, where the common optical structure is arranged to increase or spread the illumination pattern in comparison to a untransformed illumination pattern which can be provided without the common optical structure, and where the common optical structure is further arranged such that each VCSEL is arranged to provide a sector of the illumination pattern, where each sector is smaller than the illumination pattern.

The steps need not necessarily be performed in the order given above.

The common optical structure may be integrated by several methods, among them grinding, lapping, etching, soft-cushion imprint lithography followed by etching, UV-replication of a master structure on the wafer followed by a etch-transfer of the replicated structure in the semiconductor substrate and the like. Furthermore, wafer bonding of e.g. a glass wafer including a multitude of common optical structures to the semiconductor wafer may be used. Alternatively, a curable polymer may be provided and subsequently processed by means of processing light (e.g. UV or blue light). Details of such a process are described, for example, on page 2, line 2 to page 5, line 19 of WO 2017/055160 A1. Furthermore, FIGS. 2-10 and the corresponding description on page 9, line 20 to page 11, line 20 provides a special example of such a process. The disclosure of WO 2017/055160 A1 is incorporated by reference.

The common optical structure may be covered by a planarization layer as described above. The planarization layer is characterized by a lower refractive index than a material of the optical structure. The optical structure may be designed with respect to the refractive index of the planarization layer in order to provide the desired illumination pattern. The planarization layer may be used to smooth the surface irregularities caused by the optical structure. The planarization layer may include materials like silicone, epoxy, polyimide, SiN and the like. The difference between the refractive index of the semiconductor layer structure (semiconductor substrate or one or more semiconductor layers) which is used to manufacture the optical structure and the refractive index of the planarization layer is sufficient to provide the illumination pattern for a multitude of applications. The planarization layer may protect the common optical structure and may simplify further processing steps in order to process microlenses on top of the common optical structure as described above.

It shall be understood that the VCSEL array of claim 1-12, the lighting device of claim 13 and the method of claim 15 have similar and/or identical embodiments, in particular, as defined in the dependent claims.

It shall be understood that a preferred embodiment of the invention can also be any combination of the dependent claims with the respective independent claim.

Further advantageous embodiments are defined below.

These and other aspects of the invention will be apparent from and elucidated with reference to the embodiments described hereinafter.

The invention will now be described, by way of example, based on embodiments with reference to the accompanying drawings.

In the Figures, like numbers refer to like objects throughout. Objects in the Figures are not necessarily drawn to scale.

Various embodiments of the invention will now be described by means of the Figures.

Figure 1:
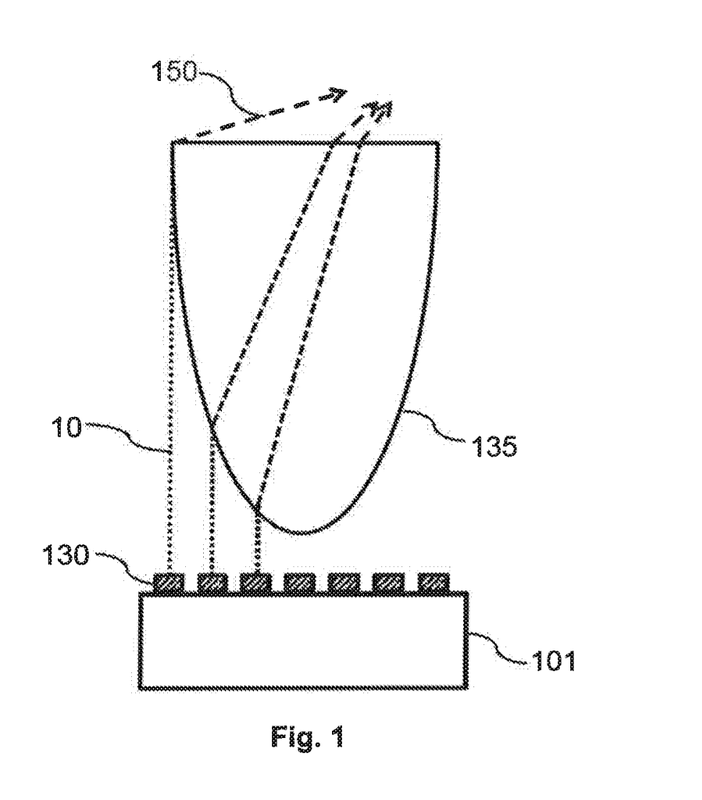
FIG. 1 shows a principal sketch of a cross-section of a VCSEL array.
Figure 2:
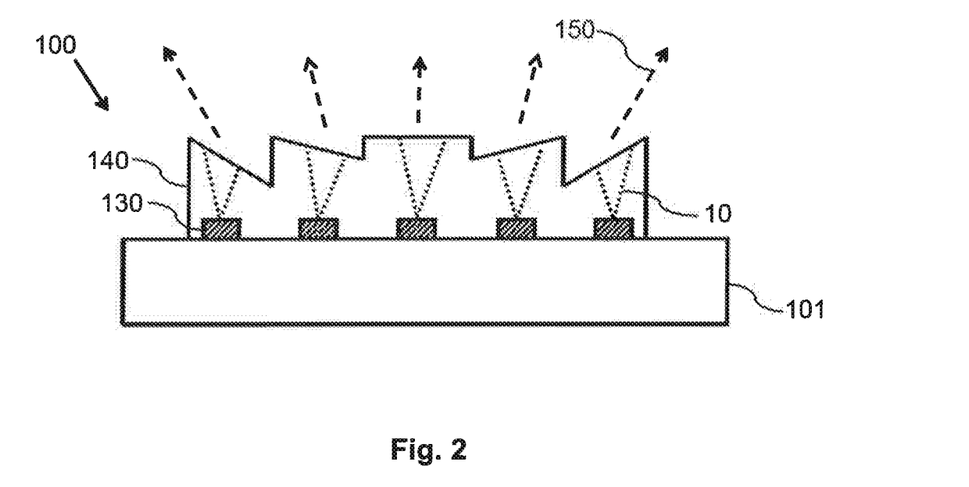
FIG. 2 shows a principal sketch of a cross-section of a first VCSEL array.

FIG. 1 shows a principal sketch of a cross-section of a prior art VCSEL array. The prior art VCSEL array includes a semiconductor substrate 101 (gallium arsenide—GaAs) with a multitude of VCSELs 130 processed on top of the semiconductor substrate 101. The VCSELs are arranged to emit laser light 10 away from the semiconductor substrate 11 (top emitter). A separate volume lens 135 is provided above the prior art VCSEL array in order to provide a rectangular illumination pattern covering a field of view of 110°×90°. The height of the separate volume lens 135 is 0.95 mm. It is therefore impossible to integrate such a volume lens 135 on a VCSEL array with a semiconductor substrate 101 with a thickness of 200 μm. It is especially impossible to integrate a multitude of such volume lenses 135 on wafer FIG. 2 shows a principal sketch of a cross-section of a first VCSEL array 100. The cross-section is taken across a centerline of the first VCSEL array 100. Five mesas of top emitting VCSELs 130 provided on top of a semiconductor substrate are shown. Each VCSEL 130 emits laser light with the emission cone of 20° in air. The mesas are embedded in an optical polymer building a common optical structure 140. The common optical structure 140 consists of a continuous block of cured polymer. The cross-section showed that the upper surface of the common optical structure 140 consists of adjacent flat but inclined sub-surfaces (facets) which are separated by steps. Each VCSEL 130 illuminates one respective sub-surface (or facet) in order to illuminate a respective sector of a defined illumination pattern. The steps enable a low maximum building height of the common optical structure 140 above the processing surface of the semiconductor substrate 101 of in this case 150 μm. The laser light 10 does only illuminate a part of the facets such that no light is emitted to the steps in order to avoid optical losses. The common optical structure 140 is in this case a prismatic structure in order to image transformed laser light 150 in a defined field of view in order to provide the defined illumination pattern.

Figure 3:
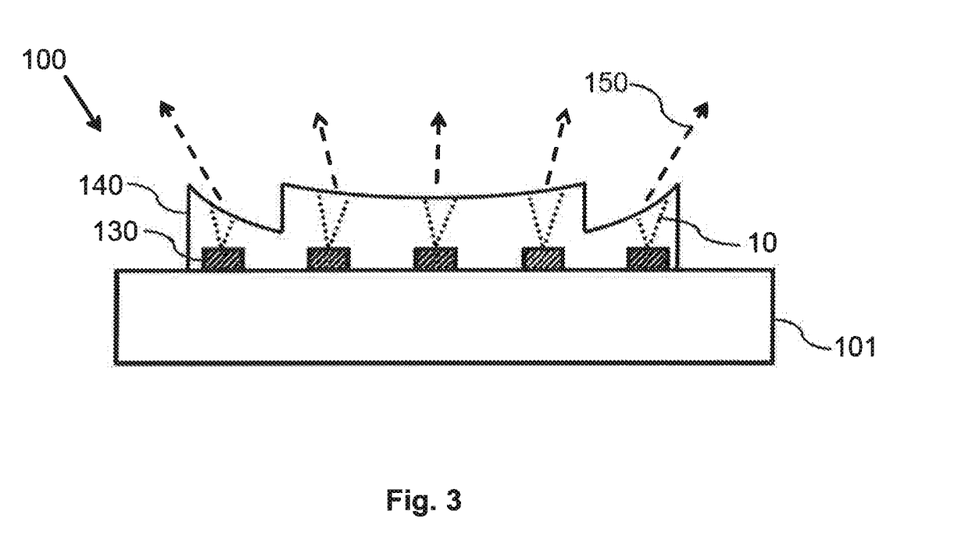
FIG. 3 shows a principal sketch of a cross-section of a second VCSEL array.

FIG. 3 shows a principal sketch of a cross-section of a second VCSEL array 100. The configuration of the VCSELs 130 and the semiconductor substrate 101 is the same as discussed with respect to FIG. 2. The common optical structure 140 consists again of a curable optical polymer as described above. The common optical structure 140 includes again steps in order to provide sub-surfaces for imaging transformed laser light 150 to the respective sectors of an illumination pattern. The sub-surfaces are in this case curved such that the common optical structure 140 is a Fresnel type lens. Three VCSELs 130 are arranged in the middle of the cross-section emitted laser light 10 to one common curved sub-surface of the Fresnel type lens.

Figure 4:
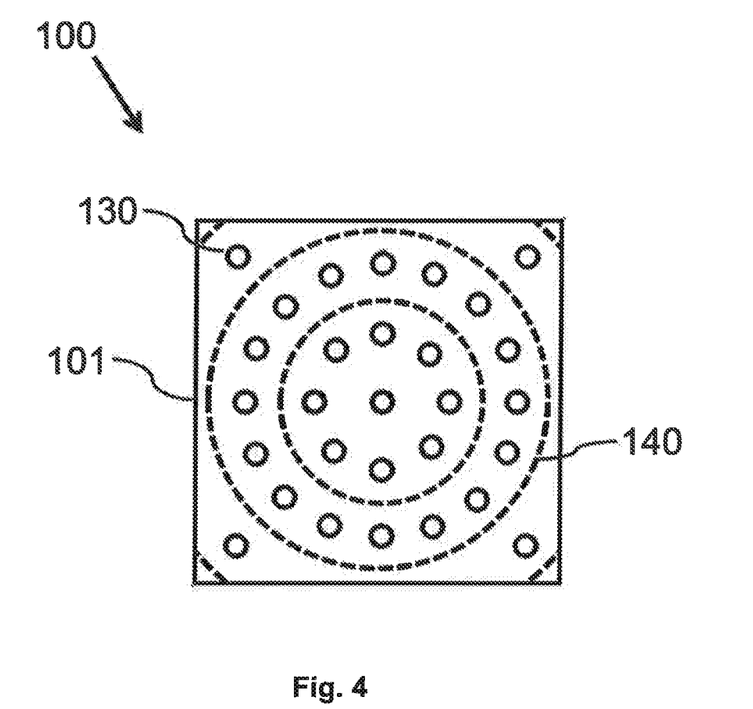
FIG. 4 shows a principal sketch of a top view of a third VCSEL array.

FIG. 4 shows a principal sketch of a top view of a third VCSEL array 100 similar as discussed with respect to FIG. 3. The VCSEL array 100 is quadratic and the VCSELs 130 are arranged in circles around a center VCSEL 130. The circular sections show the circular symmetric sub-surfaces of a Fresnel type common optical structure 140 as discussed with respect to FIG. 3. Nine VCSELs 130 are arranged in the center emitting laser light to a center sub-surface of the common optical structure 140. 16 VCSELs 130 are arranged on a circle around the center emitting laser light one common first circular symmetric sub-surface around the center sub-surface of the common optical structure 140. Four VCSELs 130 are arranged in the corners of the VCSEL array 100 emitting laser light to a part of a second circular symmetric sub-surface arranged around the first circular symmetric sub-surface of the common optical structure 140.

Figure 5:
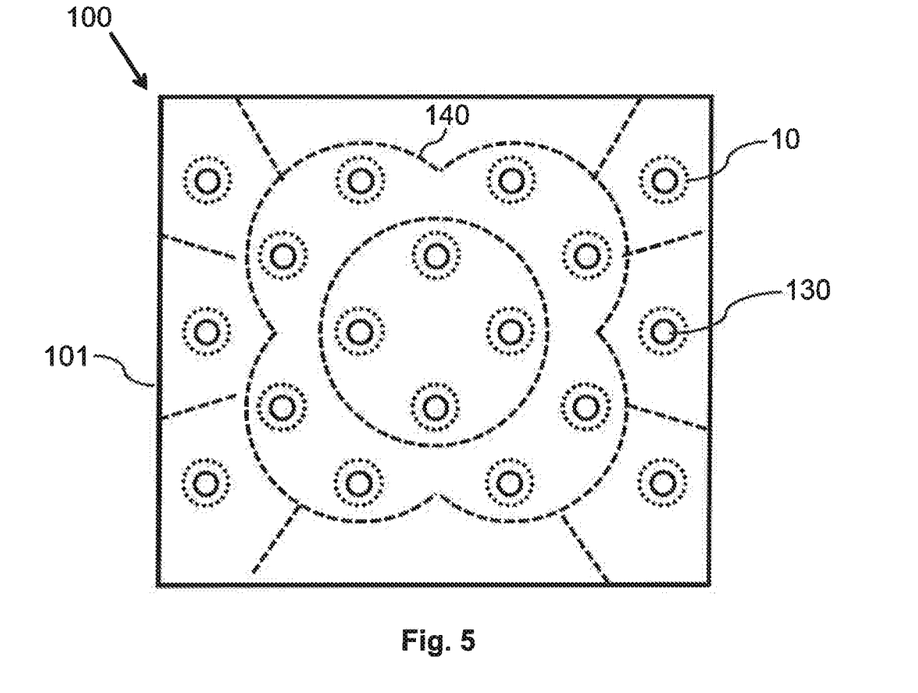
FIG. 5 shows a principal sketch of a top view of a fourth VCSEL array.
Figure 6:
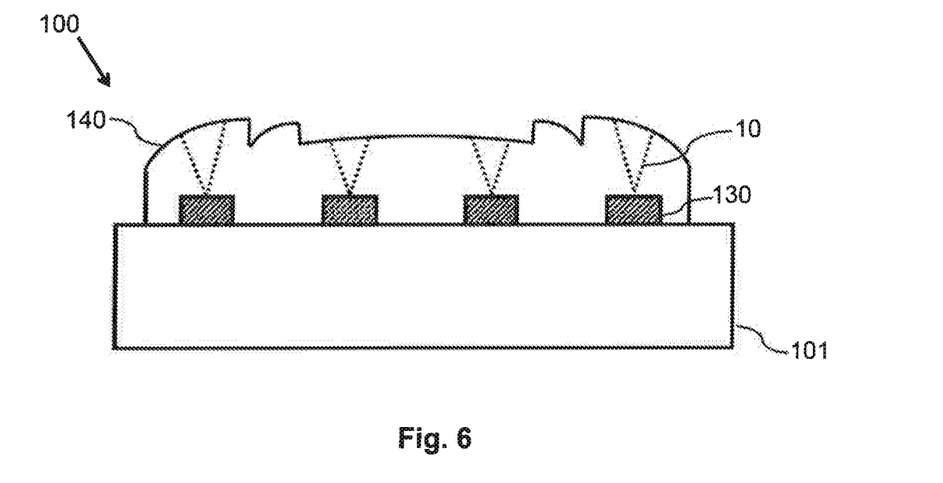
FIG. 6 shows a principal sketch of a cross-section of the fourth VCSEL array.

FIG. 5 shows a principal sketch of a top view of a fourth rectangular VCSEL array 100. The VCSELs 130 are provided in a hexagonal arrangement on top of the semiconductor substrate 101. A cross-section along the four VCSELs arranged in the middle of the VCSEL array 100 is shown in FIG. 6. The common optical structure 10 is again a Fresnel type lens. The laser light 10 is depending on the position within the VCSEL array 100 emitted to sub-surfaces receiving only light from one respective VCSELs or sub-surfaces receiving laser light 10 from two or more respective VCSELs 130. Building height of the common optical structure, size and position of the sub-surfaces, size of the light emitting area of the VCSELs 130 and emission cone of the laser light 10 emitted by the VCSELs 130 is again arranged such that no step of the Fresnel type lens is illuminated in order to avoid optical losses. It is clear from FIG. 6 that parts of the common optical structure 140 which are not illuminated by laser light 10 may be removed without affecting the optical function of the common optical structure 140.

Figure 7:
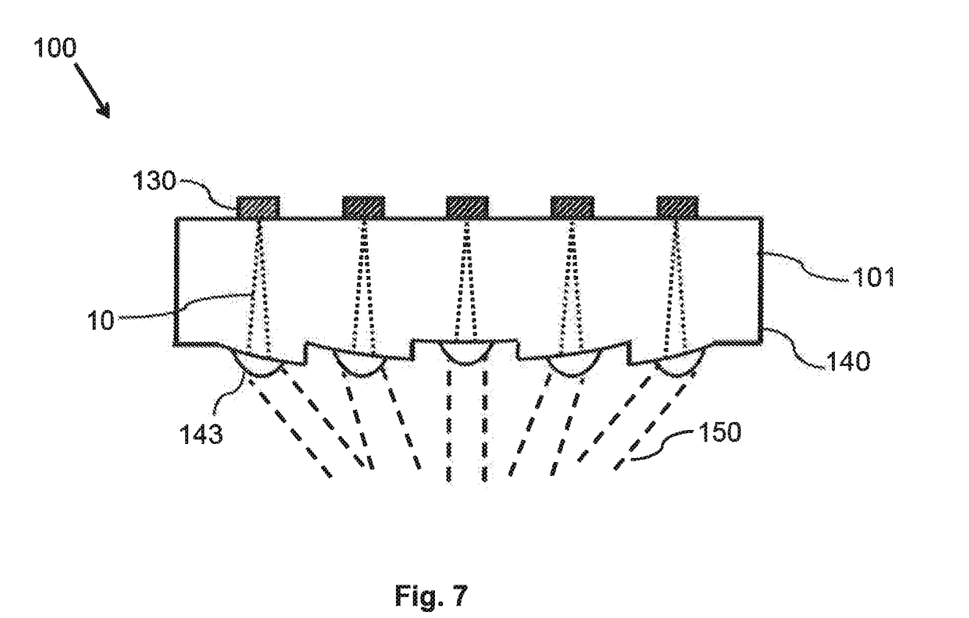
FIG. 7 shows a principal sketch of a cross-section of a fifth VCSEL array.

FIG. 7 shows a principal sketch of a cross-section of a fifth VCSEL array 10. The cross-section shows again an example with five VCSELs 130 emitting laser light 10 through the semiconductor substrate 101 (bottom emitter). The common optical structure is in this case a Fresnel type lens etched in the bottom surface (surface opposite to the surface on which the VCSELs 130 are processed) of the semiconductor substrate 101. The high refractive index of the GaAs semiconductor substrate 101 of n=3.5 enables a rather low-profile of the common optical structure 140. An array of microlenses is provided on top of the sub-surfaces of the Fresnel type lens. The microlenses 143 are etched together with the common optical structure 140 in the semiconductor substrate 101. Each VCSEL 130 is associated with one microlens 143 in order to provide transformed laser light 150 (collimated laser beams) which is imaged to the respective sector in the reference plane.

Figure 8:
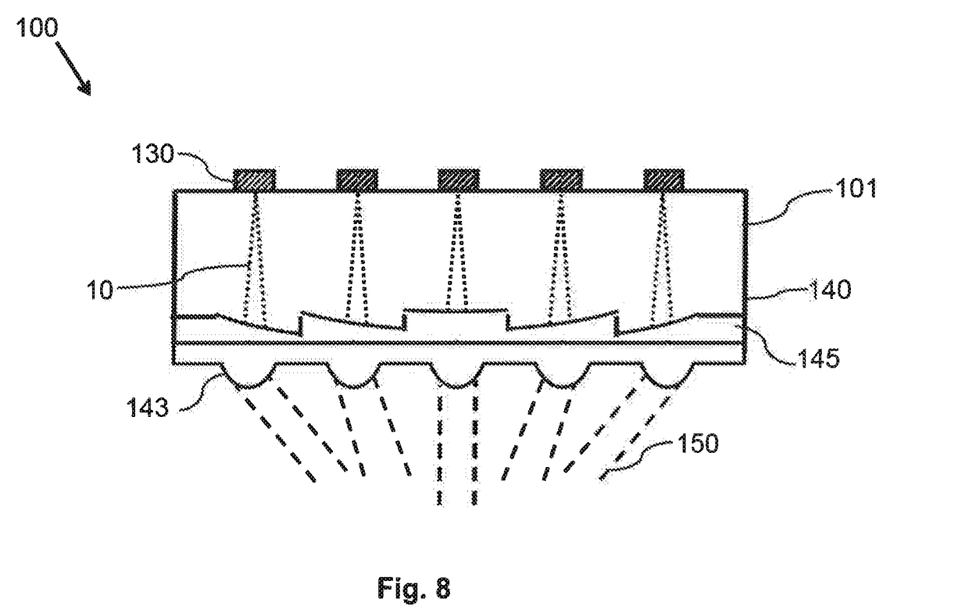
FIG. 8 shows a principal sketch of a cross-section of a sixth VCSEL array.

FIG. 8 shows a principal sketch of a cross-section of a sixth VCSEL array 100. The sixth VCSEL array 100 includes again bottom emitting VCSELs 130 as discussed with respect to FIG. 7. The common optical structure 140 is etched in the semiconductor substrate 101 as described above. A glass wafer is bonded by means of a bonding layer 145 to the semiconductor wafer including the VCSEL arrays 100. An array of microlenses 143 is in this embodiment subsequently processed (alternatively a processed glass wafer may be bonded to the semiconductor wafer including a multitude of semiconductor substrates 101) such that each microlens receives laser light 10 from one respective VCSEL as described above.

Figure 9:
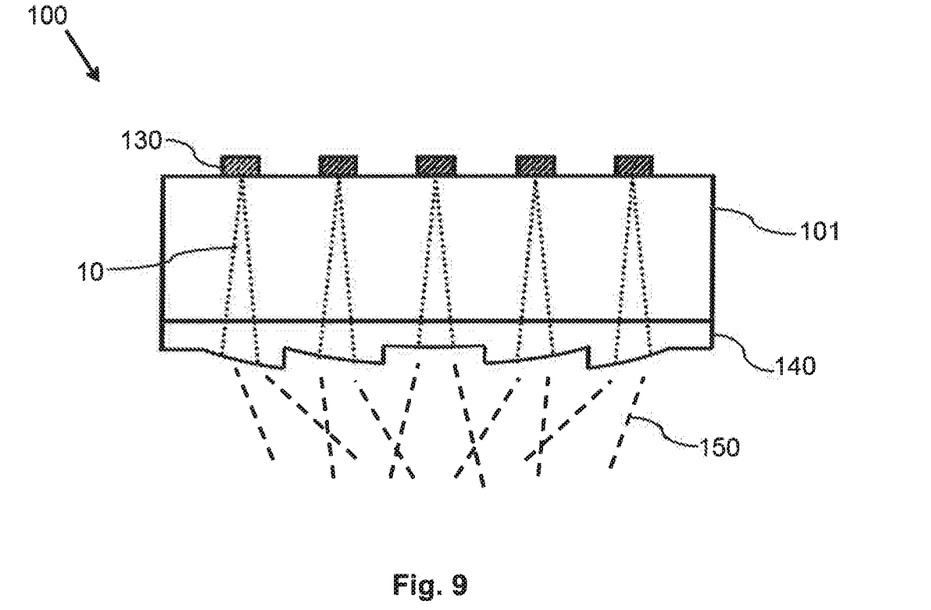
FIG. 9 shows a principal sketch of a cross-section of a seventh VCSEL array.

FIG. 9 shows a principal sketch of a cross-section of a seventh VCSEL array 100. The seventh VCSEL array 100 includes again bottom emitting VCSELs 130 as discussed with respect to FIGS. 7 and 8. A glass wafer is bonded to the semiconductor wafer including the VCSEL arrays 100. The glass wafer is processed such that each VCSEL array 100 is aligned with one common optical structure 140.

Figure 10:
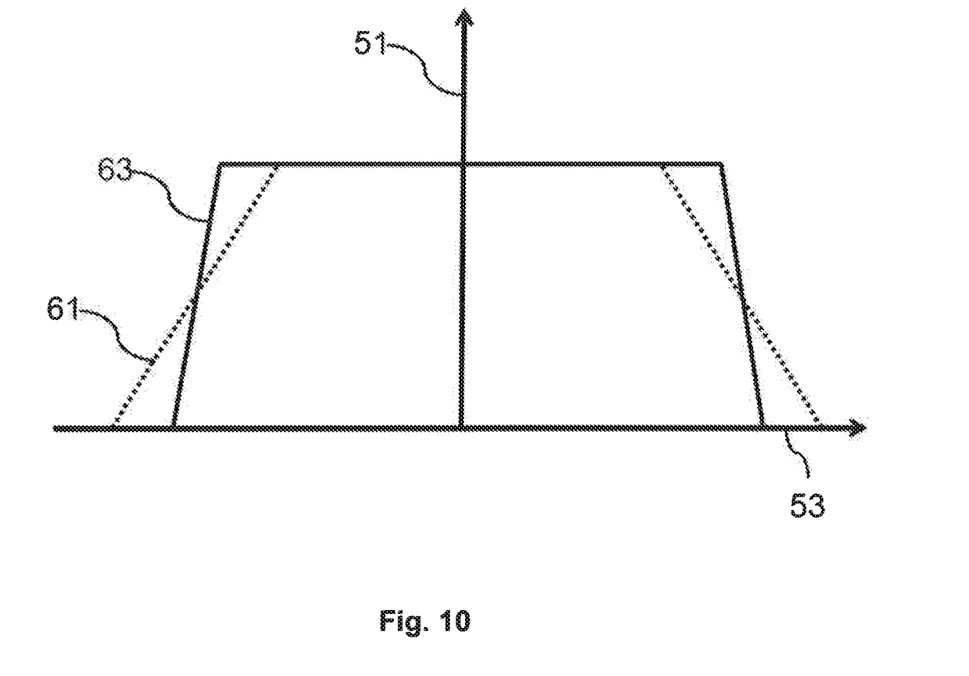
FIG. 10 shows two examples of intensity distributions in one defined field of view.
Figure 11:
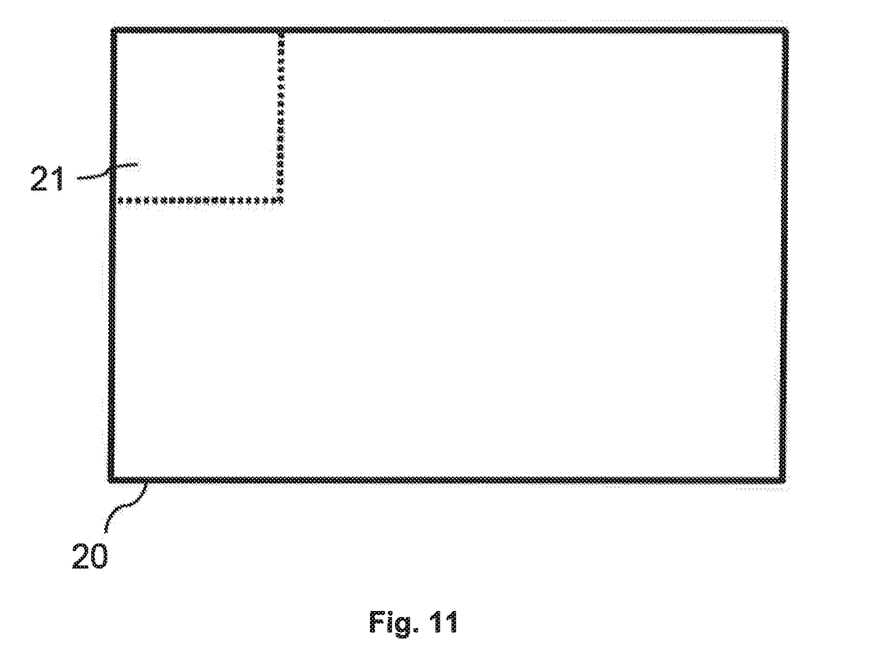
FIG. 11 shows a principal sketch of the illumination pattern.

FIG. 10 shows two examples of intensity distributions in one defined field of view. The ordinate is assigned to the intensity 51 and the abscissa is assigned to the angle 53 along one cross-section parallel to the surface of the illumination pattern in the field of view. The dotted line 61 shows a prior art intensity distribution which can be provided by a prior art diffusor. The intensity distribution rises slowly reaches a flat plateau and declines slowly going from left to right. The illumination pattern therefore includes a broad rim with changing intensity distribution. Only the area of the flat plateau is used for illumination purposes. The light emitted to the rim and the corresponding energy is therefore wasted. The solid line 63 shows an improved intensity distribution which can especially be provided, for example, by means of the embodiments of the VCSEL array 100 discussed with respect to FIG. 7 and FIG. 8. The common optical structure 140 transforms the laser light 10 to transformed laser light 150 such that the laser light of each VCSEL 130 is directed to one associated sector 21 of the illumination pattern 20 as shown in FIG. 11. Which VCSEL 130 is associated to one respective sector 21 depends on the inclination with respect to the optical axis of the respective VCSEL 13 of the respective part of surface of the common optical structure 140 to which the laser light 10 is directed. The associated microlens 143 collimates laser light 10 such that the divergence is reduced such that the improved illumination pattern 63 is achieved.

Figure 12:
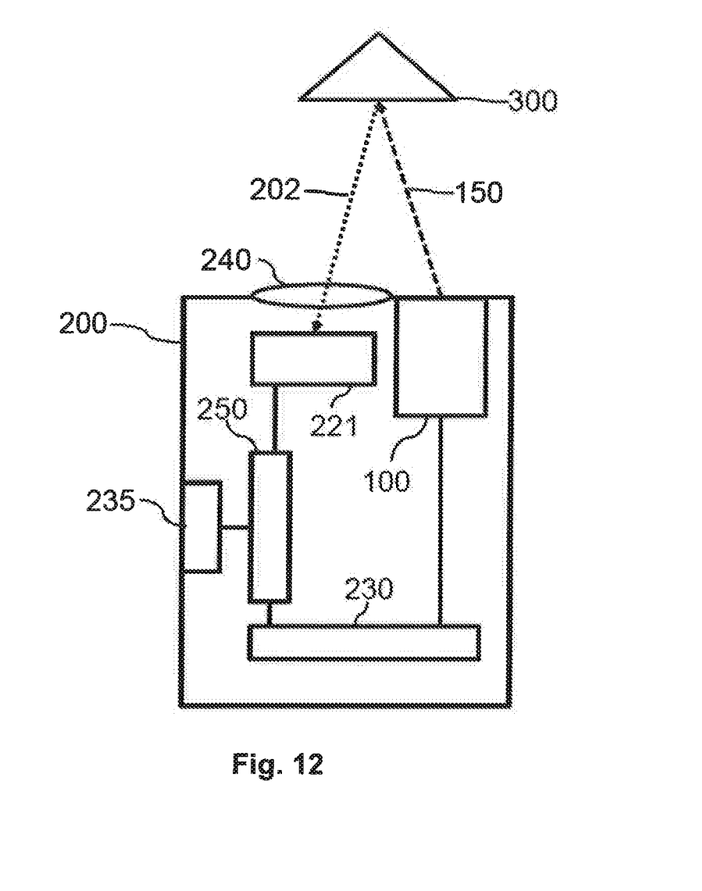
FIG. 12 shows a principal sketch of a time-of-flight sensor module.

FIG. 12 shows a principal sketch of a time-of-flight sensor module 200. The time-of-flight sensor module 200 includes a VCSEL array 100 in accordance with the one of the embodiments discussed above. The time-of-flight sensor module 200 further includes a detector 221 which is arranged to detect very short light pulses. Such short laser pulses may be caused by transformed laser light 150 emitted by the VCSEL array 100 hitting an object 300. A part of the transformed laser light 150 is reflected by the object 300 such that reflected laser light 202 is received by optical device 240 (e.g. lens or lens arrangement) which images the received laser light to detector 221. The reflected laser light 202 causes a corresponding electrical signal in the detector 221. An electrical driver 230 may be arranged to electrically drive the VCSEL array or optionally each VCSEL or sub-groups of VCSELs of the VCSEL array 100 separately. A controller 250 is connected with the electrical driver 230 in order to control, for example, start and stop time of the laser pulse emitted by VCSEL array 100. The controller 250 is further connected with the detector 221 in order to receive the electrical signal caused by the reflected laser light 202 detected by detector 221. The time-of-flight sensor module 200 further includes an optional interface 235 to transfer start and stop time of the transformed laser light 150 emitted by the corresponding VCSEL or group of VCSELs as well as time of reception of the electrical signal caused by the reflected laser light 202. The transferred data can be used to calculate the time-of-flight of the laser light and therefore a distance between the time-of-flight sensor module 200 and the object 300. The time-of-flight sensor module 200 may alternatively include an evaluator electrically connected with the controller 250 (or may include or be included by controller 250) in order to determine the distance to the object. Several distance measurements may be used to determine a velocity or even an acceleration of the object 300. The illumination pattern 20 provided by means of the VCSEL array be adapted to the optical device 240. The intensity may, for example, increase at the rim of the illumination pattern 20 in order to compensate optical losses of the optical device 240.

Figure 13:
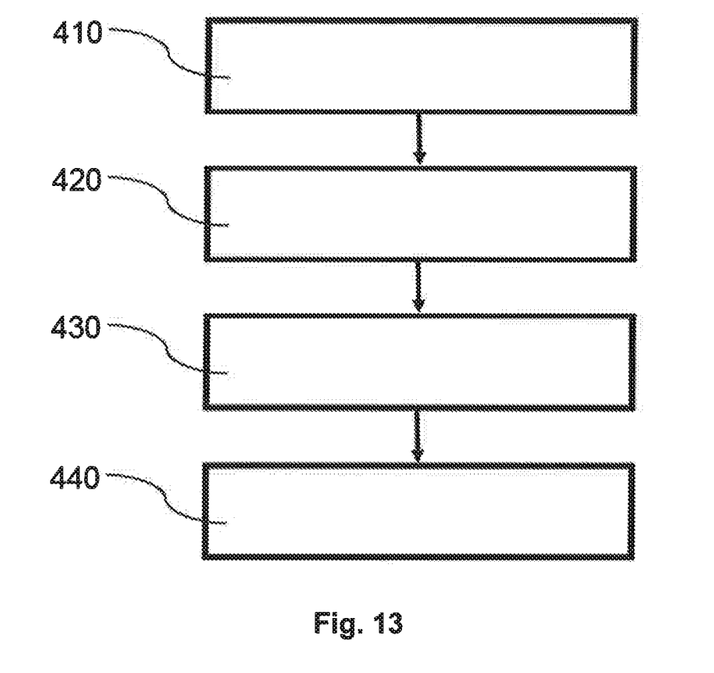
FIG. 13 shows a principal sketch of a process flow of a method of fabricating a VCSEL array.

FIG. 13 shows a principal sketch of a process flow of a method of fabricating a VCSEL array 100. In step 410 a semiconductor substrate 101 is provided. The semiconductor substrate 101 is part of a semiconductor wafer. In the subsequent step 420 at least two VCSELs 130 are provided on a processing side of the semiconductor substrate 101. Common optical structures 140 are integrated on wafer level in step 430 such that one common optical structure 140 is associated with one corresponding VCSEL array 100. The common optical structure 140 is provided in step 440. The common optical structure 140 is arranged to transform the laser light 10 to transformed laser light 150 such that a continuous illumination pattern 20 can be provided in the reference plane which. The common optical structure 140 is arranged to increase the illumination pattern 20 in comparison to an untransformed illumination pattern which can be provided without the common optical structure 140. The common optical structure 140 is further arranged such that each VCSEL 130 is arranged to provide a sector 21 of the illumination pattern 20. Each sector 21 is smaller than the illumination pattern 20.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 10 laser light
20 illumination pattern
21 sector of illumination pattern
51 intensity
53 angle
61 prior art intensity distribution
63 improved intensity distribution
100 VCSEL array
101 semiconductor substrate
130 VCSEL
135 separate volume lens
140 common optical structure
143 array of microlenses
145 bonding layer
150 transformed laser light
200 time of flight camera
202 reflected laser light
221 light detector
230 electrical driver
235 interface
240 optical device
250 controller
300 object
410 step of providing semiconductor substrate
420 step of providing at least two VCSELs
430 step of integrating common optical structure
440 step of arranging common optical structure

The invention claimed is:

1. A vertical cavity surface emitting laser (VCSEL) array comprising two, three, four, or more VCSELs arranged on a common semiconductor substrate,
wherein the VCSEL array further comprises one common optical structure integrated on a wafer level,
wherein the common optical structure is arranged to transform laser light to transformed laser light such that a continuous illumination pattern can be provided in a reference plane,
wherein the common optical structure is arranged to increase a size of the illumination pattern in the reference plane in comparison to an untransformed illumination pattern providable without the common optical structure,
wherein the common optical structure is further arranged such that each of the VCSELs is arranged to illuminate a sector of the illumination pattern, the sector being smaller than the illumination pattern,
wherein the common optical structure comprises steps such that subsurfaces of the common optical structure with a different height above the common semiconductor substrate are arranged next to each other,
wherein the common optical structure is a prismatic structure or a Fresnel structure,
wherein each of the VCSELs is associated with a respective subsurface of the subsurfaces of the common optical structure,
wherein a distance between each of the VCSELs and a size of the respective subsurface of the common optical structure is arranged such that each of the VCSELs illuminates only a part of the respective subsurface of the common optical structure without illuminating one of the steps,
wherein the VCSEL array comprises an array of microlenses, and
wherein each of the VCSELs is associated with a microlens of the array of microlenses, the microlens being arranged to collimate the laser light after traversing the common optical structure.

2. The VCSCL array according to claim 1, wherein the common optical structure is a continuous structure arranged above light emitting surfaces of the VCSELs.

3. The VCSEL array according to claim 1,
wherein each of the VCSELs is a bottom emitter which is arranged to emit the laser light through the common semiconductor substrate, and
wherein the common optical structure is provided on a surface of the common semiconductor substrate which is arranged opposite with respect to the VCSELs.

4. The VCSEL array according to claim 3, wherein the common optical structure is integrated in a semiconductor structure, of the common semiconductor substrate, of the VCSEL array.

5. The VCSEL array according to claim 1,
wherein each of the VCSELs is a top emitter which is arranged to emit the laser light in a direction away from the common semiconductor substrate,
wherein the common optical structure comprises a material provided on top of a semiconductor layer structure of the VCSEL array, and
wherein the material is transparent in a wavelength range of the laser light.

6. The VCSEL array according to claim 1,
wherein each of the VCSELs is a bottom emitter,
wherein the common optical structure is etched in a common semiconductor substrate,
wherein the common optical structure comprises the steps such that the subsurfaces of the common optical structure with the different height above the common semiconductor substrate are arranged next to each other,
wherein each of the VCSELs is associated with the respective subsurface of the common optical structure,
wherein the distance between each of the VCSELs and the size of the respective subsurface of the common optical structure is arranged such that each of the VCSELs illuminates only the respective part of the respective subsurface of the common optical structure without illuminating one of the steps,
wherein the array of micro lenses is integrated in a transparent carrier, and
wherein the transparent carrier is mechanically coupled to the common semiconductor substrate.

7. The VCSEL array according to claim 1, wherein at least a part of the VCSELs are arranged to be individually controlled to emit the laser light.

8. A light emitting device comprising at least one of the VCSEL array according to claim 1, and an electrical driver for providing an electrical drive current to the VCSELs.

9. A time-of-flight camera comprising the light emitting device according to claim 8, and a light detector for detecting transformed laser light reflected by an object, and wherein and evaluator is arranged to determine a distance to the object by means of the transformed laser light detected by the light detector.

10. A method of fabricating a vertical cavity surface emitting laser (VCSEL) array, the method comprising the steps of:
providing a semiconductor substrate;
providing at least two VCSELs on the semiconductor substrate;
integrating a common optical structure on a wafer level;
arranging the common optical structure to transform a laser light to transformed laser light such that a continuous illumination pattern can be provided in a reference plane,
wherein the common optical structure is arranged to increase the continuous illumination pattern in the reference plane in comparison to a untransformed illumination pattern providable without the common optical structure,
wherein the common optical structure is further arranged such that each of the VCSELs is arranged to provide a sector of the continuous illumination pattern, the sector being smaller than the illumination pattern,
wherein the common optical structure comprises steps such that subsurfaces of the common optical structure with a different height above the semiconductor substrate are arranged next to each other, and
wherein the common optical structure is a prismatic structure or a Fresnel structure;
associating each of the VCSELs with a respective subsurface of the subsurfaces of the common optical structure;
arranging a distance between each of the VCSELs and a size of the respective subsurface of the common optical structure such that each of the VCSELs illuminates only a part of the respective subsurface of the common optical structure without illuminating one of the steps;
providing an array of microlenses; and
associating each of the VCSELs with a microlens of the array of microlenses, the microlens being arranged to collimate the laser light after traversing the common optical structure.

* * * * *